United States Patent [19]

Harris et al.

[11] Patent Number: 4,743,645

[45] Date of Patent: May 10, 1988

[54] COMPOSITION FOR MAKING CIRCUIT BOARD SUBSTRATES AND ELECTRICAL CONNECTORS

[75] Inventors: James E. Harris, Piscataway; Lloyd M. Robeson, Whitehouse Station, both of N.J.

[73] Assignee: Amoco Corporation, Chicago, Ill.

[21] Appl. No.: 859,229

[22] Filed: May 5, 1986

Related U.S. Application Data

[60] Continuation of Ser. No. 736,782, May 22, 1985, abandoned, which is a division of Ser. No. 516,863, Jul. 25, 1983, Pat. No. 4,520,067, which is a continuation of Ser. No. 391,422, Jun. 23, 1982, abandoned.

[51] Int. Cl.⁴ ............................................. C08L 81/06
[52] U.S. Cl. .................................. 524/456; 525/534; 525/535
[58] Field of Search ................. 525/534, 535; 524/456

[56] References Cited

U.S. PATENT DOCUMENTS 3,729,527 4/1973 Nield .................................... 525/534
4,175,175 11/1979 Johnson et al. ...................... 528/125

FOREIGN PATENT DOCUMENTS 1348639 3/1974 United Kingdom ................ 525/534

*Primary Examiner*—Wilbert J. Briggs, Sr.
*Attorney, Agent, or Firm*—Donald M. Papuga; William H. Magidson; Ralph C. Medhurst

[57] ABSTRACT

Described herein is a composition useful for making circuit board substrates and electrical connectors comprising a blend of a poly(ether sulfone) and polysulfone. Also described herein is a circuit board substrate and an electrical connector made from such a blend.

11 Claims, 1 Drawing Sheet

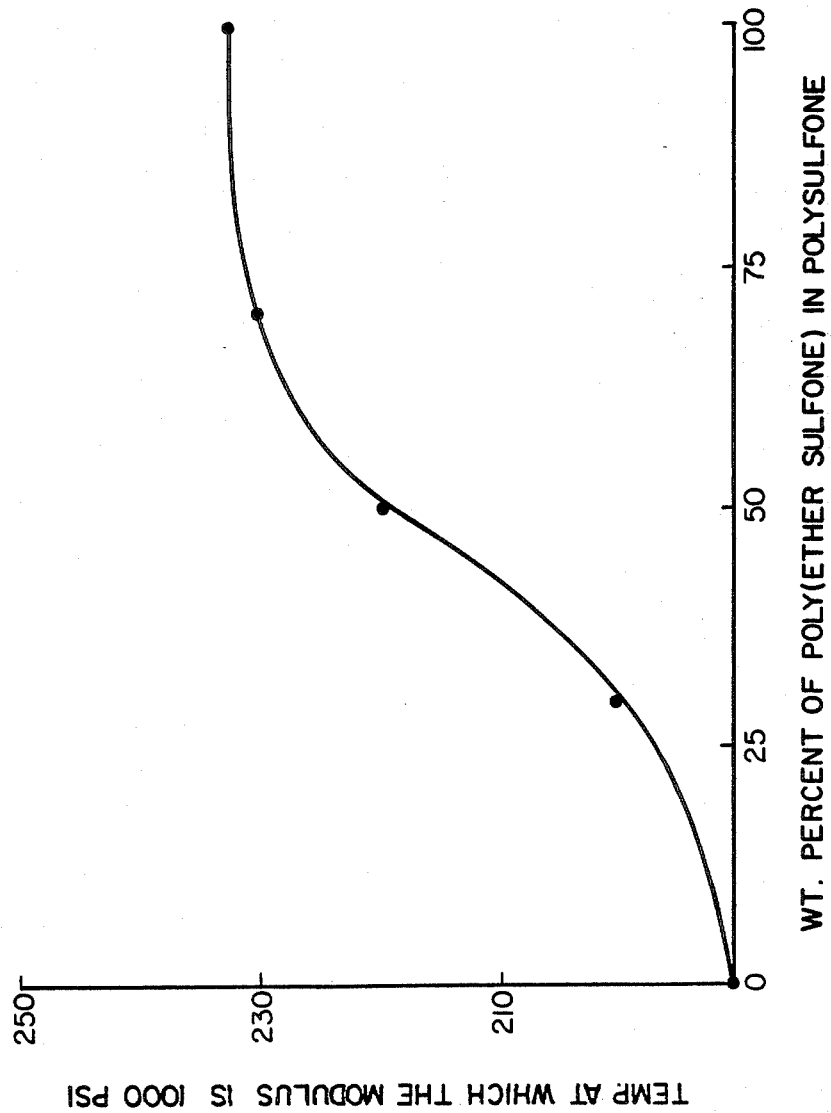

COMPOSITION FOR MAKING CIRCUIT BOARD SUBSTRATES AND ELECTRICAL CONNECTORS

This application is a continuation of prior U.S. application Ser. No. 736,782, filed May 22, 1985, now abandoned, which is a division of application Ser. No. 516,863, filed July 25, 1983, now U.S. Pat. No. 4,520,067, which is a continuation of application Ser. No. 391,422, filed June 23, 1982, now abandoned.

BACKGROUND OF THE INVENTION

This invention is directed to a composition useful for making circuit board substrates and electrical connectors comprising a blend of a poly(ether sulfone) and polysulfone. Additionally this invention relates to a circuit board substrate and electrical connector made from such a blend.

U.S. Pat. No. 4,281,038 describes a non-conductive substrate (board) for a printed circuit made from a thermoplastic selected from polyphenyloxide, polyphenylsulfide, polyimide and polyethersulfone. The thermoplastic has dispersed therein discrete particles of a material such as iron, copper, compounds of iron and compounds of copper which have a coating of a bonding assistant such as a silicone resin, an organic silane and a silane ester.

Circuit boards are widely used in the electrical industry for radio, television, computers, appliances, industrial and electronic equipment. Printed circuit boards have been traditionally manufactured from a copper clad epoxy-glass laminate. When starting with this material the shape of the printed circuit board must first be routed out and the holes for mounting the components (e.g., transistors, resistors, integrated circuits, etc.) individually drilled. The board is then masked with photoresist, the circuitry imaged and the copper etched away from areas where it is not wanted. An alternative to this procedure is to injection mold the circuit board substrate with the holes in place. The molded substrate is then put through several adhesion promotion steps and plated with electroless copper according to standard technology, to produce the printed circuit board. In this case the substrate material is limited to thermoplastic resins with sufficient thermal stability and chemical properties to survive wave soldering. Also, savings may result with these injection molded circuit board substrates due to the elimination of considerable mechanical processing such as routing and drilling.

The critical parameters of a printed circuit board, from a soldering standpoint, are its heat distortion temperature, environmental stress crack resistance and thermal expansion coefficient. The higher a substrate's heat distortion temperature and environmental stress crack resistance to solder fluxes, the less likely it will blister or delaminate during soldering.

When a polysulfone based on bisphenol A is molded into a circuit board substrate it has a heat distortion temperature which is generally too low for soldering temperatures such as those encountered in wave soldering. A circuit board substrate molded from poly(ether sulfone) is resistant to specific etching solutions (e.g., chromic acid) and is thus harder to prepare suitable surfaces for plating. Additionally, circuit boards molded from poly(ether sulfone) do not have, in many instances, acceptable plateability. Acceptable plateability requires good adhesion of electrolessly plated copper to the substrate.

BRIEF DESCRIPTION OF THE DRAWING

FIG. 1—Materials of Controls A, B, and C, and Examples 1, 2, and 3, were compression molded and their 1 percent secant moduli measured. As the temperature rose, the moduli of the materials decreased. This figure shows the temperature at which the moduli decreased to 1000 psi.

DESCRIPTION OF THE INVENTION

It has now been found that when a polysulfone is added to a poly(ether sulfone), a circuit board substrate molded from the resultant composition has improved plateability. The combination of polysulfone and poly(ether sulfone) yields adequate heat distortion temperatures and susceptibility to chromic acid etching such that the combination performs better than the individual components in molding circuit board substrates.

The composition used for making circuit board substrates and electrical connectors comprises from about 40 to about 90, preferably from about 50 to about 85, weight percent of a poly(ether sulfone) and from about 10 to about 60, preferably from abut 15 to about 50, weight percent of polysulfone.

The poly(ether sulfone) suitable for use in this invention include homopolymers, co- and higher polymers having repeating units of the following formula:

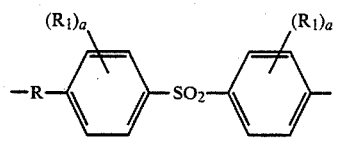

wherein R is selected from O and S, each $R_1$ is independently hydrogen, a halogen atom, an alkyl groups of from 1 to 4 carbon atoms and an alkoxy group of from 1 to 4 carbon atoms and a is an integer of 0 to 4.

Perferably, the poly(ether sulfone) has repeating units of the following formula:

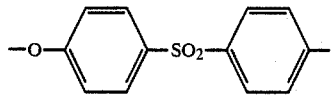

These polymers are well known in the art and are described in, for example, U.S. Pat. Nos. 4,175,175 and 4,008,203.

A preferred copolymer contains units of the following formulae:

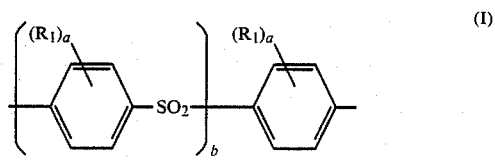

and

-continued

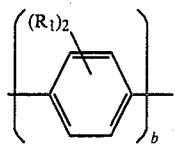

wherein $R_1$ and a are defined as above, and b is independently an integer of 1 to 3. The ratio of unit (I) to unit (II) is preferably greater than 1. Units (I) and (II) are attached to each other by an —O— bond.

The preferred copolymer contains units of the formula:

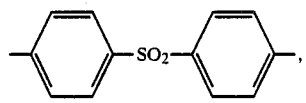

and

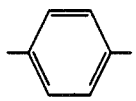

The polysulfone suitable for use in this invention includes homopolymers and co- and higher polymers having repeating units of the following formula:

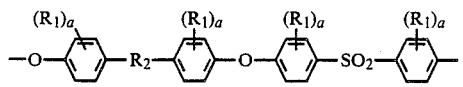

wherein $R_1$ and a are defined as above and $R_2$ is a bond between aromatic carbon atoms or a divalent connecting radical. Preferably, $R_2$ is a divalent connecting radical of the formula:

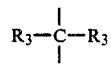

wherein $R_3$ is independently selected from lower alkyl, aryl and halogen substituted groups thereof. Preferably $R_3$ is methyl.

Preferably the polysulfone has repeating units of the formula:

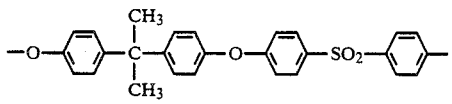

These polymers are well known in the art and are described in, for example, U.S. Pat. No. 4,175,175.

The composition may contain other ingredients such as stabilizers, i.e., metal oxides such as zinc oxide, antioxidants, flame retardants, pigments, fibers, inorganic fillers, and the like. Preferably, the composition contains fibers and/or inorganic fillers.

The reinforcing fiber includes fiberglass, carbon fibers, and the like, and mixtures thereof. The particulate inorganic fillers which may be used include wollastonite, calcium carbonate, glass beads, talc, mica and the like, or mixtures thereof.

The fiber reinforcement, filler or combinations thereof, is utilized in amounts of from 0 to about 50 weight percent, preferably from about 10 to about 35 weight percent.

The compositions of this invention are prepared by any conventional mixing methods. For example, a preferred method comprises mixing the poly(ether sulfone), polysulfone and other optional ingredients in powder or granular form in an extruder and extruding the mixture into strands, chopping the strands into pellets and molding the pellets into the desired circuit board substrate and electrical connector.

The composition of this invention can be molded into circuit board substrates and electrical connectors using conventional techniques. Specifically, the composition can be molded into circuit board substrates using conventional molding equipment. The molded boards are then swelled and etched to promote the adhesion of copper by both roughening the surface and introducing chemical moieties through oxidation. The circuitry is then applied to the board by either a conventional additive or a semiadditive process. In either case copper is applied to the substrate in an electroless manner after the application of catalysts which activate the surface to the deposition of metal in a conventional manner.

EXAMPLES

The following Examples serve to give specific illustrations of the practice of this invention but they are not intended in any way to limit the scope of this invention.

Control A

A polysulfone of the following formula

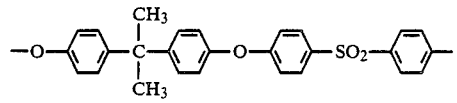

having a reduced viscosity of 0.43 as measured in chloroform (0.2 gram polymer in 100 ml at 25° C.) was injection molded into ASTM test bars (at 270°–300° C.) using a Newburg ¼ ounce screw injection molding machine. The test bars were measured for the following properties: tensile strength and modulus according to ASTM D-638; elongation at break according to ASTM D-638; notched izod impact strength according to ASTM D-256; tensile impact strength according to ASTM D-1822; heat distortion temperature measured at 264 psi on a ⅛ inch thick unannealed test bar according to ASTM D-638; melt flow according to ASTM D-1238-73 and pendulum impact strength according to the following procedures:

A sample one inch long by one-eighth inch wide (1–30 mils thick) is mounted in the jaws such that it is transverse to the path of a pendulum and located at the bottom of the swing. The ⅛ inch face of the sample is impacted with the ¼ inch diameter striking head of the pendulum. The pendulum is released from its starting position and allowed to swing through its cycle without a sample. The recovery height of zero energy loss is determined in this way. The cycle is repeated with a sample mounted in the path of the pendulum. The recovery height is again determined. Since the breaking of the specimen extracted energy from the pendulum, the same recovery height is not attained. The difference in the recovery height (i.e., the difference in the potential energy of the pendulum at the maximum point of the upswing) represents the energy absorbed by the specimen during rupture. The impact strength, expressed in foot-pounds per cubic inch, is obtained by dividing the pendulum energy loss by the volume of the specimen. Five to ten specimens are tested for each material.

The results are shown in Table I.

Control B

A poly(ether sulfone) of the following formula

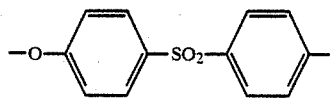

having a reduced viscosity of 0.48 (as measured in N-methyl pyrrolidone at 25° C.) was injection molded into ASTM test bars and tested as described in Control A.

The results are shown in Table I.

EXAMPLE 1

A blend of 90 weight percent of the poly(ether sulfone) of Control B and 10 weight percent of the polysulfone of Control A was prepared by extrusion blending in a single screw 1-inch diameter extruder with L/D=36/1 at 300°-320° C.

The extrudate was chopped into pellets. The pellets were injection molded into ASTM test bars and tested as described in Control A.

The results are shown in Table I.

EXAMPLE 2

The procedure of Example 1 was exactly repeated except that 70 weight percent of the poly(ether sulfone) of Control B and 30 weight percent of the polysulfone of Control A were used.

The results are shown in Table I.

EXAMPLE 3

The procedure of Example 1 was exactly repeated except that 50 weight percent of the poly(ether sulfone) of Control B and 50 weight percent of the polysulfone of Control A were used.

The results are shown in Table I.

Control C

The procedure of Example 1 was exactly repeated except that 30 weight percent of the poly(ether sulfone) of Control B and 70 weight percent of the polysulfone of Control A were used.

The results are shown in Table I.

TABLE I

| Description of the Composition Polymer[1] | (wt %) | Tensile Modulus (psi) | Tensile Strength (psi) | Elongation (%) | Notched Izod Impact Strength (ft-lbs/in of notch) | Tensile Impact Strength (ft-lbs/$in^2$) | Heat Distortion Temperature (°C.) | Pendulum Impact Strength (ft-lbs/$in^3$) | $MF_{10}$ (350° C.) 44 psi. (dg/min) | $MF_{10}$ (400° C.) 44 psi. (dg/min) | $MF_{30}$ (400° C.) 44 psi. |
|---|---|---|---|---|---|---|---|---|---|---|---|
| A  PS | (100) | 370,000 | 10,500 | 70-100 | 1.2 | 100-150 | 168 | 165 | 17 | | 0 |
| B  PES | (100) | 389,000 | 11,700 | 88 | 1.6 | 183 | 201 | 166 | 9.9 | | 0 |
| PS | (10) | 393,000 | 11,800 | 104 | 1.8 | 185 | 198 | 142 | 11.0 | 36.7 | 0 |
| PES | (90) | | | | | | | | | | |
| PS | (30) | 391,000 | 11,500 | 88 | 1.6 | 181 | 190 | 208 | 13.8 | 36.1 | 0 |
| PES | (70) | | | | | | | | | | |
| PS | (50) | 397,000 | 11,200 | 93 | 1.4 | 172 | 183 | 156 | 15.3 | 45.0 | 0 |
| PES | (50) | | | | | | | | | | |
| C  PS | (70) | 403,000 | 11,000 | 80 | 1.3 | 146 | 182 | 134 | 17.6 | 47.6 | 0 |
| PES | (30) | | | | | | | | | | |

[1] polysulfone
PES=poly(ether sulfone)

Control D 70 weight percent of the polysulfone of Control A was blended with 30 weight percent of fiberglass (OCF-197B made by Owens Corning Fiberglass) in a 1-inch extruder with L/D=24/1 at about 300° C. The extrudate was chopped into pellets. The pellets were injection molded into ASTM test bars and tested for the following properties: tensile strength and modulus according to ASTM D-638; elongation at break according to ASTM D-638; notched izod impact strength according to ASTM D-256; tensile impact strength according to ASTM D-1822 and heat distortion temperature measured at 264 psi on a ⅛ inch thick unannealed test bar according to ASTM D-638.

The results are shown in Table II.

Control E

The procedure of Control D was exactly repeated except that 70 weight percent of the poly(ether sulfone) of Control B was blended with 30 weight percent of the fiberglass described in Control D.

The results are shown in Table II.

EXAMPLE 4

The procedure of Control D was exactly repeated except that 50 weight percent of the poly(ether sulfone) of Control B was blended with 20 weight percent of the polysulfone of Control A and 30 weight percent of the fiberglass described in Control D.

The results are shown in Table II.

EXAMPLE 5

The procedure of Control D was exactly repeated except that 40 weight percent of the poly(ether sulfone) of Control B was blended with 30 weight percent of the polysulfone of Control A and 30 weight percent of the fiberglass described in Control D.

The results are shown in Table II.

EXAMPLE 6

The procedure of Control D was exactly repeated except that 35 weight percent of the poly(ether sulfone) of Control B was blended with 35 weight percent of the polysulfone of Control A and 30 weight percent of the fiberglass described in Control D.

The results are shown in Table II.

Control F

The procedure of Control D was exactly repeated except that 20 weight percent of the poly(ether sulfone) of Control B was blended with 50 weight percent of the polysulfone of Control A and 30 weight percent of the fiberglass described in Control D.

The results are shown in Table II.

EXAMPLE 9

The procedure of Example 7 was exactly repeated except that 27 weight percent of the polysulfone of Control A was blended with 41 weight percent of the poly(ether sulfone) of Control B, 15 weight percent of the Wollastonite described in Example 7, 15 weight percent of the fiberglass described in Control D and 2

TABLE II

| Example | Description of the Composition Ingredients[1] | (wt %) | Tensile Modulus (psi) | Tensile Strength (psi) | Elongation (%) | Notched Izod Impact Strength (ft-lbs/ in of notch) | Tensile Impact Strength (ft-lbs/in$^2$) | Heat Distortion Temperature (°C.) |
|---|---|---|---|---|---|---|---|---|
| Control D | PS | (70) | 1,240,000 | 17,900 | 1.9 | 1.8 | 69 | 182 |
|  | Fiberglass | (30 |  |  |  |  |  |  |
| Control E | PES | (70) | 1,160,000 | 18,700 | 2.7 | 1.7 | 97 | 217 |
|  | Fiberglass | (30) |  |  |  |  |  |  |
| 4 | PES | (50) | 1,250,000 | 20,400 | 2.5 | 2.0 | 93 | 215 |
|  | PS | (20) |  |  |  |  |  |  |
|  | Fiberglass | (30 |  |  |  |  |  |  |
| 5 | PES | (40) | 1,310,000 | 20,200 | 2.2 | 2.1 | 81 | 203 |
|  | PS | (30) |  |  |  |  |  |  |
|  | Fiberglass | (30) |  |  |  |  |  |  |
| 6 | PES | (35) | 1,310,00 | 18,400 | 1.8 | 2.0 | 105 | 190 |
|  | PS | (35) |  |  |  |  |  |  |
|  | Fiberglass | (30) |  |  |  |  |  |  |
| Control F | PES | (20) | 1,260,000 | 19,200 | 2.1 | 2.0 | 74 | 185 |
|  | PS | (50) |  |  |  |  |  |  |
|  | Fiberglass | (30) |  |  |  |  |  |  |

[1]PS = polysulfone
PES = poly(ether sulfone)

The following Examples 7 to 9 describe blends of polysulfone, poly(ether sulfone), filler and/or reinforcing agent.

weight percent of zinc oxide stabilizer.
The results are shown in Table III.

| Example | Description of the Composition Ingredients[1] | (wt %) | Tensile Modulus (psi) | Tensile Strength (psi) | Elongation (%) | Notched Izod Impact Strength (ft-lbs/ in of notch) | Tensile Impact Strength (ft-lbs/in$^2$) | Heat Distortion Temperature (°C.) |
|---|---|---|---|---|---|---|---|---|
| 7 | PS | (40) | 614,000 | 9,180 | 3.2 | 1.0 | 29 | 182 |
|  | PES | (30) |  |  |  |  |  |  |
|  | Wollastonite | (30) |  |  |  |  |  |  |
| 8 | PS | (35) | 628,000 | 9,180 | 2.9 | 0.9 | 25 | 183 |
|  | PES | (35) |  |  |  |  |  |  |
|  | Wollastonite | (30) |  |  |  |  |  |  |
| 9 | PS | (27) | 912,000 | 13,500 | 2.4 | 1.2 | 13 | 198 |
|  | PES | (41) |  |  |  |  |  |  |
|  | Wollastonite | (15) |  |  |  |  |  |  |
|  | Fiberglass | (15) |  |  |  |  |  |  |
|  | ZnO | (2) |  |  |  |  |  |  |

[1]PS = polysulfone
PES = poly(ether sulfone)

EXAMPLE 7

40 weight percent of the polysulfone of Control A was blended with 30 weight percent of the poly(ether sulfone) of Control B and 30 weight percent of particulate wollastonite (Nyad N-400 sold by Nyco, a division of Processed Minerals, Inc. in an extruder with L/D equal to 24/1 at 300° C. The extrudate was chopped into pellets. The pellets were injection molded into ASTM test bars and tested as described in Control D.

The results are shown in Table III.

EXAMPLE 8

The procedure of Example 7 was exactly repeated except that 35 weight percent of the polysulfone of Control A was blended with 35 weight percent of the poly(ether sulfone) of Control B and 30 weight percent of the Wollastonite described in Example 7.

The results are shown in Table III.

Control G 65 weight percent of the polysulfone of Control A was blended with 15 weight percent of the fiberglass of Control D, 18 weight percent of the wollastonite of Example 7 and 2 weight percent of zinc oxide stabilizer in a ZSK-53 Werner Pfleider twin screw extruder at 380° C. The extrudate was chopped into pellets. The material used for the circuit board was tested for the following properties; tensile strength and modulus according to ASTM D-638; flexural strength and modulus according to ASTM D-790; elongation at break according to ASTM D-638; tensile impact strength according to ASTM D-1822 and the linear thermal expansion coefficient was measured according to ASTM D-696.

The results are shown in Table IV.

EXAMPLE 10

The procedure of Control G was exactly repeated except that 26.4 weight percent of the polysulfone of Control A, 40 weight percent of the poly(ether sulfone) of Control B, 15 weight percent of the fiberglass of Control D, 16.6 weight percent of the wollastonite of Example 7, and 2 weight percent of zinc oxide were used.

The results are shown in Table IV.

| Example | Description of the Composition Ingredients[1] | (wt %) | Tensile Strength (psi) | Tensile Modulus (psi) | Flexural Strength (psi) | Flexural Modulus (psi) | Elongation (%) | Tensile Impact Strength (ft-lb/sq in) | Linear Thermal Expansion Coeff. (°C.$^{-1}$ × 10$^5$) |
|---|---|---|---|---|---|---|---|---|---|
| Control G | PS | (65) | 12,000 | 780,000 | 19,100 | 798,000 | 2.6 | 20 | 2.8 |
|  | Fiberglass | (15) |  |  |  |  |  |  |  |
|  | Wollastonite | (18) |  |  |  |  |  |  |  |
|  | ZnO | (2) |  |  |  |  |  |  |  |
| 10 | PS | (26.4) | 14,000 | 870,000 | 20,200 | 840,000 | 2.5 | 28 | 2.8 |
|  | PES | (40) |  |  |  |  |  |  |  |
|  | Fiberglass | (15) |  |  |  |  |  |  |  |
|  | Wollastonite | (16.6) |  |  |  |  |  |  |  |
|  | ZnO | (2) |  |  |  |  |  |  |  |

PS = polysulfone
PES = poly(ether sulfone)

EXAMPLE 11

The materials of Control G and Example 10 were molded in an injection molding machine at 400° C. into a circuit board 3½×5 inches. The boards were then annealed at 335° F. for four hours followed by swell and etch steps to promote copper adhesion. These steps consisted of a dip in a solution of approximately 7 percent by weight water in N,N,-dimethyformamide at 80° F., followed by a water rinse, then dipping in chromosulfuric acid at 170° F. The chromosulfuric acid bath had a composition such as:

| Component | Percentage in Mixture (Weight Percent) |
|---|---|
| 96% H$_2$SO$_4$ | 55.9 |
| 85–87% H$_3$PO$_4$ | 10.4 |
| CrO$_3$ | 3.0 |
| H$_2$O | 30.7 |

Following the etchant, the board was plated with copper by an additive process which consists of chemically sensitizing the substrate, photographically imaging the circuitry, developing the image and plating electroless copper to form the electrically conductive network.

Finished boards were then soldered using conventional wave soldering equipment at several speeds using commercial water soluble and Freon based solder fluxes. Boards molded from the material in Example 10 were solderable at temperatures as high as 495° F. while those molded from the material in Control G were not solderable above 460° F., since above these temperatures the copper separated from the substrate surface resulting in failure.

EXAMPLE 12

Materials of Controls A, B and C, and Examples 1, 2 and 3 were compression molded in a 20 mil 4×4 inch cavity mold at 300° C. into films 20 mils thick. Their 1 percent secant moduli were measured according to a procedure similar to ASTM D-638 between 25° and 250° C. As the temperature rose the moduli of the materials decreased. The temperatures at which the moduli decreased to 1000 psi are shown in FIG. 1. If the composition contains between 40 and 90 weight percent of poly(ethersulfone), much higher temperatures can be reached with the modulus above 1000 psi as compared with those that can be reached with the polysulfone of Control A.

What is claimed is:

1. A composition useful for making circuit board substrates and electrical connectors comprising a blend of: (A) from about 40 to about 90 weight percent of a poly(ether sulfone) having repeating units of the following formula:

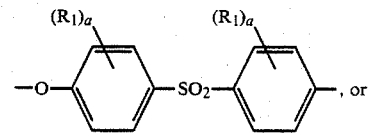

, or repeating units of the following formula:

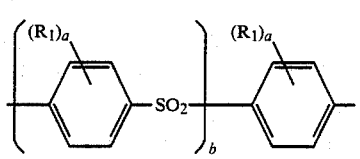

(I)

and

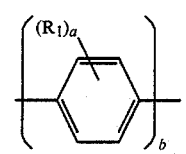

(II)

wherein b is independently an integer of 1 to 3, units (I) and (II) are attached to each other by an —O— bond, and (B) from about 10 to about 60 weight percent of a polysulfone having repeating units of the following formula:

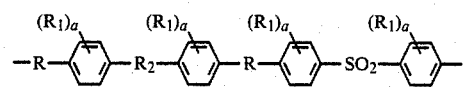

wherein R is selected from O and S, each R$_1$ is independently a halogen atom, an alkyl group of from 1 to 4 carbon atoms and an alkoxy group of from 1 to 4 carbon atoms, a is an integer of 0 to 4 and R$_2$ is a divalent connecting radical of the formula:

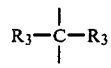

wherein R₃ is independently selected from lower alkyl, aryl and halogen substituted groups thereof.

2. A composition as defined in claim 1 wherein the poly(ether sulfone) has repeating units of the following formula:

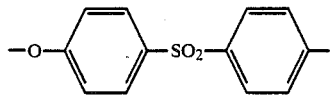

3. A composition as defined in claim 1 wherein the poly(ether sulfone) contains units of the formula:

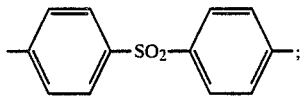

and

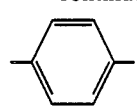

4. A composition as defined in claims 1 or 3 wherein the ratio of (I) to (II) is greater than 1.

5. A composition as defined in claim 1 wherein the polysulfone has repeating units of the formula:

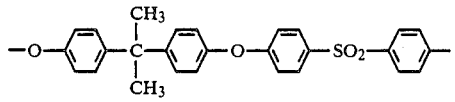

6. A composition as defined in claim 1 which contains a reinforcing fiber.

7. A composition as defined in claim 6 wherein the fiber is fiberglass.

8. A composition as defined in claim 1 which contains a particulate inorganic filler.

9. A composition as defined in claim 8 wherein the filler is wollastonite.

10. A composition as defined in claim 1 which contains a reinforcing fiber and a particulate inorganic filler.

11. A composition as defined in claim 11 which contains fiberglass and wollastonite.

* * * * *